United States Patent
Takahashi et al.

(10) Patent No.: US 10,011,901 B2
(45) Date of Patent: Jul. 3, 2018

(54) VAPOR DEPOSITION METHOD AND VAPOR DEPOSITION APPARATUS

(71) Applicant: NuFlare Technology, Inc., Kanagawa (JP)

(72) Inventors: Hideshi Takahashi, Kanagawa (JP); Yuusuke Sato, Tokyo (JP)

(73) Assignee: NuFlare Technology, Inc., Kanagawa (JP)

( * ) Notice: Subject to any disclaimer, the term of this patent is extended or adjusted under 35 U.S.C. 154(b) by 86 days.

(21) Appl. No.: 15/201,862

(22) Filed: Jul. 5, 2016

(65) Prior Publication Data

US 2017/0009375 A1    Jan. 12, 2017

(30) Foreign Application Priority Data

Jul. 6, 2015    (JP) .................. 2015-135407

(51) Int. Cl.

| C30B 25/16 | (2006.01) |
| C23C 16/02 | (2006.01) |
| C23C 16/46 | (2006.01) |
| C23C 16/52 | (2006.01) |
| C30B 25/10 | (2006.01) |

(52) U.S. Cl.
CPC .......... *C23C 16/0209* (2013.01); *C23C 16/46* (2013.01); *C23C 16/52* (2013.01); *C30B 25/10* (2013.01); *C30B 25/16* (2013.01)

(58) Field of Classification Search
CPC ......... C30B 25/00; C30B 23/00; C30B 25/16; C30B 25/18
See application file for complete search history.

(56) References Cited

U.S. PATENT DOCUMENTS

2013/0316490 A1* 11/2013 Aida ................ H01L 21/02422
438/95

FOREIGN PATENT DOCUMENTS

| JP | 11112098 A2 | 4/1999 |
| JP | 2003133248 A2 | 5/2003 |
| JP | 2013171948 A2 | 9/2013 |

* cited by examiner

*Primary Examiner* — Robert M Kunemund
(74) *Attorney, Agent, or Firm* — Rankin, Hill & Clark LLP

(57) ABSTRACT

A vapor deposition method supplies a material gas onto a substrate while heating the substrate by a heater to sequentially form a plurality of films with vapor deposition, grows the film under a constant output control, which keeps an output of the heater at a predetermined output in each of the plurality of films, until a total film thickness of the films formed on the substrate reaches a threshold value, and grows the film under a temperature feedback control, which controls the output of the heater such that a temperature of the substrate measured by a radiation thermometer becomes a predetermined temperature, after the total film thickness reaches the threshold value.

12 Claims, 3 Drawing Sheets

VAPOR DEPOSITION METHOD AND VAPOR DEPOSITION APPARATUS

CROSS REFERENCE TO RELATED APPLICATIONS

This application is based upon and claims the benefit of priority from the prior Japanese Patent Application No. 2015-135407, filed on Jul. 6, 2015, the entire contents of which are incorporated herein by reference.

FIELD

A disclosure of the present invention relates to a vapor deposition method and a vapor deposition apparatus.

BACKGROUND

An epitaxial growth technique, which grows a monocrystalline thin film of a compound semiconductor such as GaN and SiC on a monocrystalline substrate such as a sapphire substrate, a GaN substrate, a SiC substrate, and a silicon substrate, is used to produce an electronic device such as a light emitting diode (LED) and a power semiconductor.

A wafer is placed inside a film formation chamber kept at a normal pressure or a reduced pressure in a film formation apparatus used in the epitaxial growth technique. Then, when a gas as a material for film formation is supplied into the film formation chamber while the wafer is heated, a pyrolysis reaction and a hydrogen reduction reaction of a material gas occur on the surface of the wafer, thereby forming an epitaxial film on the wafer.

It is necessary to accurately control the temperature of the wafer in order to deposit a high-quality film with uniform thickness and quality on the wafer. For this reason, the temperature of the wafer is measured using a radiation thermometer and the output of a heater is controlled (for example, see Patent Literature 1).

The radiation thermometer measures the temperature of an object by measuring the strength of infrared light and visible light which is radiated from the object. The radiation thermometer can accurately measure a surface temperature of the wafer in a case in which the film having a film thickness equal to or more than a certain degree is formed on the wafer, but is difficult to measure an accurate temperature of a thin film since a thin-film interference occurs. The thin-film interference means that the infrared light and visible light radiated from the surface of the thin film and the infrared light and visible light radiated from an underlying layer of the thin film interfere with each other.

Since an emissivity is varied when the thin-film interference occurs, it is possible to improve the accuracy in measurement of the temperature by correcting the temperature on the basis of the reflectivity and the emissivity of the incident infrared light. However, an emissivity correction thermometer which performs such temperature correction uses the reflectivity depending on the surface state, and, in fact, fails to obtain a sufficient accuracy regardless of the extremely high price. Thus, there is a demand for a method which is capable of growing a film with high quality without using the emissivity correction thermometer even in a state in which the thin-film interference occurs.

DETAILED DESCRIPTION

A vapor deposition method according to one disclosure has:

supplying a material gas onto a substrate while heating the substrate by a heater to sequentially form a plurality of films with vapor deposition, growing the film under a constant output control, which keeps an output of the heater at a predetermined output in each of the plurality of films, until a total film thickness of the films formed on the substrate reaches a threshold value, and growing the film under a temperature feedback control, which controls the output of the heater such that a temperature of the substrate measured by a radiation thermometer becomes a predetermined temperature, after the total film thickness reaches the threshold value.

Figure 1:
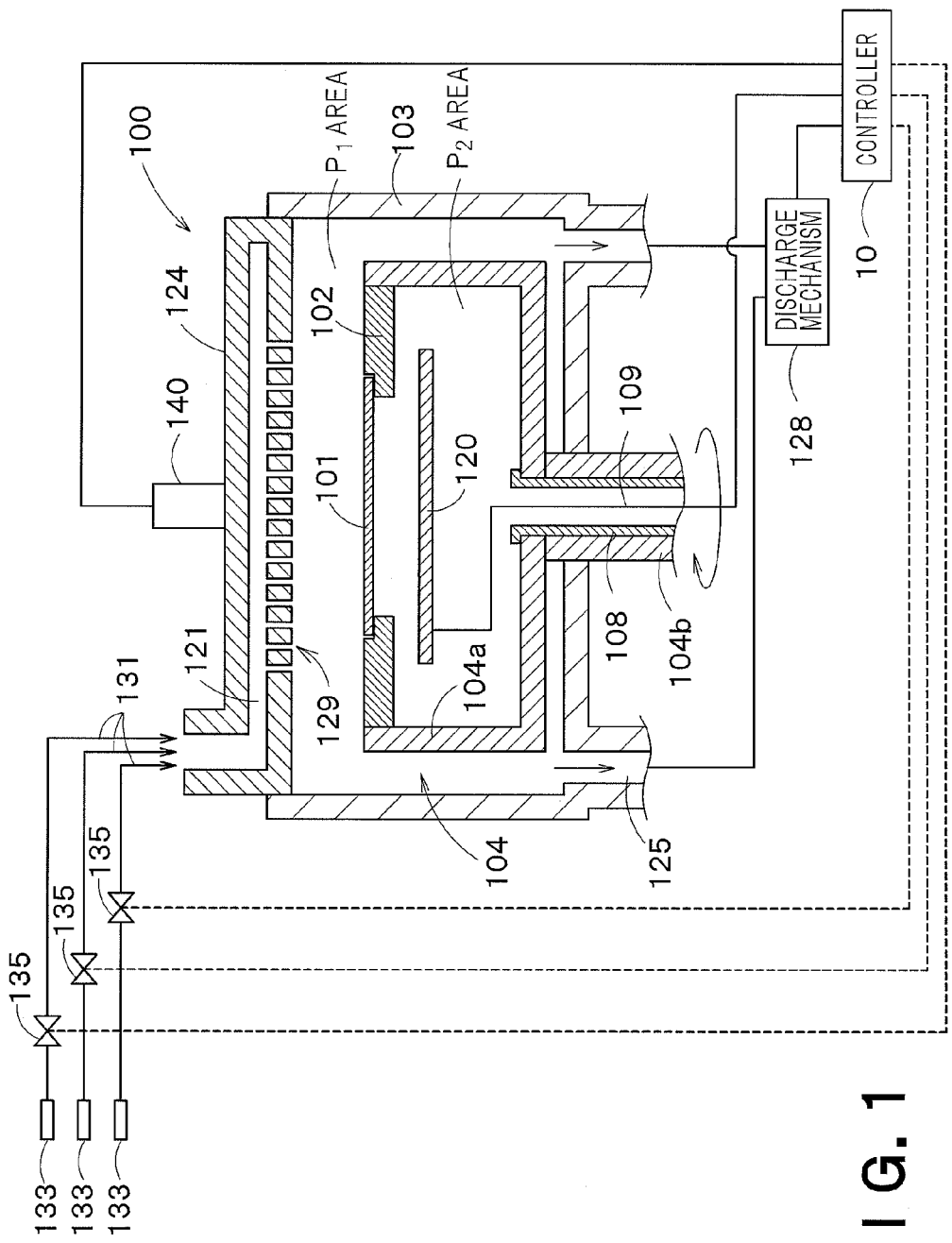
FIG. 1 is a diagram illustrating a schematic configuration of a vapor deposition apparatus 100 according to an embodiment.

FIG. 1 is a diagram illustrating a schematic configuration of the vapor deposition apparatus 100 according to this embodiment. A description will be given in this embodiment regarding an example in which a silicon substrate, and particularly, a silicon wafer (hereinafter, simply referred to as a wafer) 101 is used as a base material to be subject to a film-formation process, and a plurality of films are formed on the wafer 101. Incidentally, the wafer is not limited to the silicon substrate, and a substrate made of sapphire, GaN, SiC, and the like may be used. FIG. 1 illustrates a state in which the wafer 101 is placed on a support base 102. The vapor deposition apparatus 100 of FIG. 1 supplies plural types of material gases, which are materials to form an epitaxial film, on the wafer 101 placed on the support base 102, and forms the film on the wafer 101 through a vapor deposition reaction.

The vapor deposition apparatus 100 includes a chamber 103, which is a reaction chamber in which the epitaxial film is formed through vapor deposition on the wafer 101, the controller 10, a gas feeder 133, a gas valve 135, and a discharge mechanism 128. Incidentally, FIG. 1 illustrates the major members configuring the vapor deposition apparatus 100, and another member (not illustrated) may be provided in the vapor deposition apparatus 100 in some cases.

The support base 102 on which the wafer 101 is placed, a rotation unit 104 that rotates the support base 102, the heater 120 that serves as a heater arranged inside the rotation unit 104, and a shower plate 124 arranged above the support base 102 are provided inside the chamber 103.

For example, a ring-shaped holder is used as the support base 102, but a disc-shaped susceptor without an opening portion may be used.

The support base 102 is attached to an upper portion of the rotation unit 104, and rotates along with the rotation of the rotation unit 104. A pocket is provided in the support base 102, and an outer circumferential portion of the wafer 101 can be stably supported by the pocket. The support base 102 is planned to be exposed to high temperature, and thus, is configured, for example, by coating a surface of an isotropic graphite or SiC base material with high-heatproof and high-purity SiC by a chemical vapor deposition (CVD) method.

The rotation unit 104 includes a cylindrical portion 104a and a rotation shaft 104b which is bonded to a bottom portion of the cylindrical portion 104a. The above-described support base 102 is provided in an upper portion of the cylindrical portion 104a. The rotation shaft 104b is driven to rotate by a motor (not illustrated). When the rotation shaft 104b is rotated, the cylindrical portion 104a is also rotated in an integrated manner with the rotation shaft 104b, and the support base 102 provided in the cylindrical portion 104a is also rotated. Accordingly, it is possible to rotate the wafer 101 as long as the wafer 101 is placed on the support base 102.

The heater 120 is provided inside the cylindrical portion 104a. The heater 120 is, for example, a resistance heating heater. The heater 120 may be configured by coating a surface of a carbon or SiC base material with high-purity SiC. Power is supplied to the heater 120 through a wire 109, which passes through an inner portion of a quartz shaft 108 provided inside the rotation shaft 104b and having a substantially cylindrical shape, and heats the wafer 101 from a rear surface thereof. The wire 109 is connected to the controller 10, and the controller 10 controls the output (heating power) of the heater 120. A heating lamp and the like may be used as the heater instead of the heater 120. The controller 10 may be implemented in either hardware or software. When implemented in software, a program that realizes at least part of functions of the controller 10 may be stored on a recording medium such as a flexible disk or CD-ROM and read and executed by a computer including electric circuits. The recording medium is not limited to a removable recording medium such as a magnetic disk or optical disk, but may be a non-removable recording medium such as a hard disk device or memory. A lifting and lowering pin (not illustrated) is arranged as a substrate lifting and lowering unit inside the shaft 108. A lower end of the lifting and lowering pin extends to a lifting and lowering device (not illustrated) provided in a lower portion of the shaft 108. Further, the lifting and lowering pin can be lifted or lowered by operating the lifting and lowering device. The lifting and lowering pin is used when the wafer 101 is transported into the chamber 103, or the wafer 101 is transported out of the chamber 103. The lifting and lowering pin supports the wafer 101 from a lower side thereof and lifts up the wafer to be separated from the support base 102. Further, the wafer 101 is delivered to a transportation robot (not illustrated) of the wafer 101.

The shower plate 124 is provided in an upper portion of the chamber 103 of the vapor deposition apparatus 100. The shower plate 124 rectifies each of the plural types of material gases, configured to form the epitaxial film inside the chamber 103, and supplies the material gases like a shower toward the surface of the wafer 101 through a gas injection hole 129.

The shower plate 124 has a plate shape with a predetermined thickness. The shower plate 124 can be configured using a metal material such as stainless steel or an aluminum alloy. A gas flow path is provided inside the shower plate 124, and the plural types of gases are mixed in the shower plate and supplied to the wafer 101 inside the chamber 103 through the gas injection hole 129. A quartz window (not illustrated), configured to perform temperature measurement to be described below, is provided in the shower plate 124. Incidentally, the plural types of gases may be separately supplied to the wafer 101 in the chamber 103 by providing a plurality of the gas flow paths in the shower plate 124.

Each of the gas flow paths is connected to one end of a gas pipe 131. The other end of the gas pipe 131 is connected to the gas feeder 133 such as a gas cylinder or the like, and a gas flows at a flow rate corresponding to an opening degree of the gas valve 135. The opening degree of the gas valve 135 is controlled by the controller 10. A plurality of the gas pipes 131 and the gas feeder 133 are provided to correspond to different gases, respectively.

A plurality of gas discharger 125, configured to discharge the plural types of reacted gases, are provided in a lower portion of the chamber 103. The gas discharger 125 is connected to the discharge mechanism 128 including an adjustment valve, a vacuum pump, and the like.

The radiation thermometer 140 serving as a temperature measurement unit is provided in the upper portion of the chamber 103. The radiation thermometer 140 measures the surface temperature of the wafer 101 through the quartz window (not illustrated) provided in the shower plate 124 and a quartz window provided in the gas injection hole 129. A measurement result obtained by the radiation thermometer 140 is transmitted to the controller 10. Incidentally, 900 nm is selected as an example of a wavelength with which the radiation thermometer 140 performs the measurement, but an infrared ray, a visible light ray, or the like in another wavelength range may be selected.

The controller 10 is connected to the gas valve 135, and controls each supply amount and each supply timing of the gases. In addition, the controller 10 is connected to the discharge mechanism 128, and adjusts the pressure inside the chamber 103 to a desired pressure. Further, the controller 10 obtains the surface temperature of the wafer 101 measured by the radiation thermometer 140. In addition, the controller 10 performs a drive control of the rotation unit 104.

In addition, the controller 10 controls the output of the heater 120. The controller 10 includes two output control schemes including a "temperature feedback control" which controls the output of the heater 120 such that the measurement result obtained by the radiation thermometer 140 becomes a predetermined value, and a "constant output control" which keeps the output of the heater 120 constant regardless of the measurement result obtained by the radiation thermometer 140. The controller 10 performs the film formation on the wafer 101 while switching the control scheme between these two output control schemes.

The vapor deposition apparatus 100 according to this embodiment can be used when various films are formed on the wafer 101, and hereinafter, a description will be given regarding an example in which an AlN/AlGaN film is formed on the wafer 101, a GaN film is formed thereon, and further, a multiple quantum well (MQW) layer including indium (In) is formed thereon. The MQW layer is used as, for example, an active layer which emits light having a predetermined wavelength. In addition, the AlN/AlGaN film is used as, for example, a buffer layer of the GaN film.

Any AlN/AlGaN film serving as the buffer layer is a thin film and each film has a film thickness of less than 1 μm in many cases. For example, in a case in which the AlN/AlGaN film is first formed on the wafer 101, and the GaN film is subsequently formed thereon, and a film thickness of the film on the wafer 101 is less than 1 μm at the time of starting to form the GaN film, the controller 10 forms each film under the "constant output control", which keeps the output of the heater 120 constant, at the time of forming the AlN/AlGaN film and the GaN film.

When the film thickness from the wafer 101 exceeds 2 μm in a stage at which the GaN film formation is finished, there is a high possibility that the temperature of the film surface can be correctly measured by the radiation thermometer 140. Thus, the controller 10 forms the MQW film under the "temperature feedback control", which controls the output of the heater 120, while monitoring the temperature measured by the radiation thermometer 140.

Figure 2A:
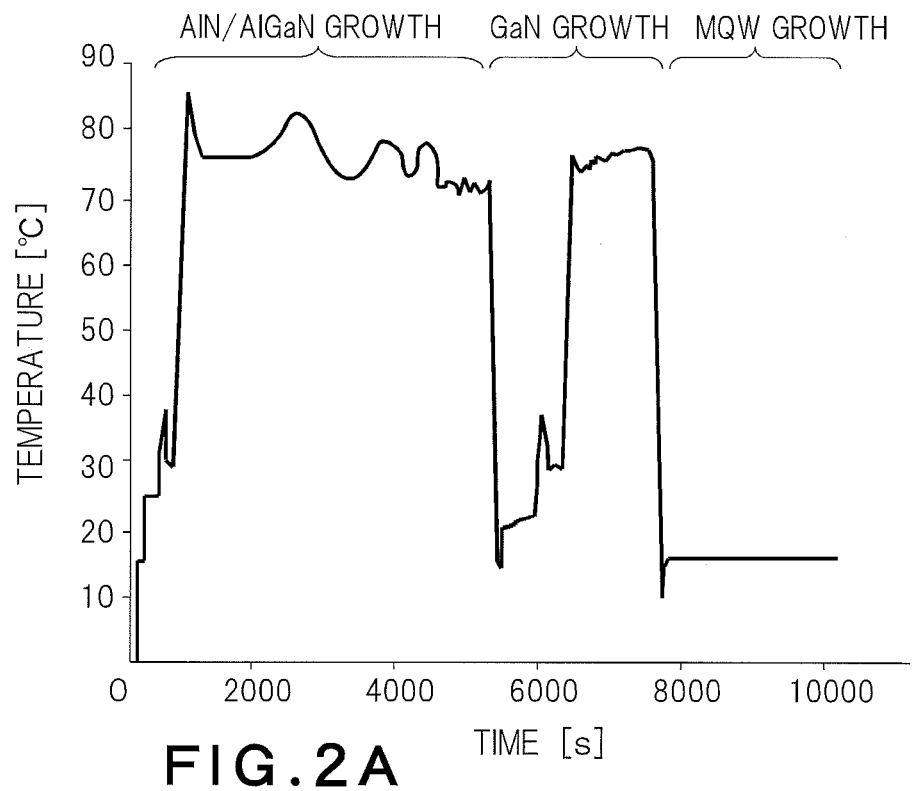
FIG. 2A is a graph illustrating a temperature change measured by a radiation thermometer 140 at the time of forming three types of films.
Figure 2B:
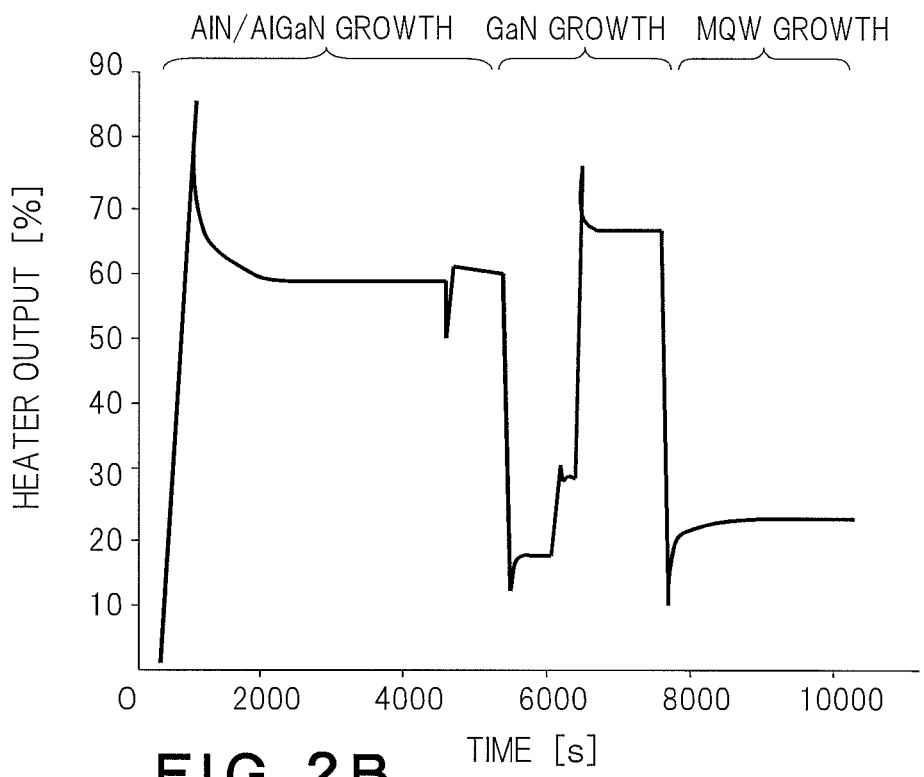
FIG. 2B is a graph illustrating an output of a heater 120 at the time of forming the three types of films.

FIG. 2A is a graph illustrating a temperature change measured by the radiation thermometer 140 at the time of forming three types of films, and FIG. 2B is a graph illustrating the output of the heater 120 at the time of forming the above-described three types of films. The horizontal axis of FIG. 2A indicates a time [t], and the vertical axis thereof indicates a temperature [° C.]. The horizontal axis of FIG. 2B indicates a time [t], and the vertical axis thereof indicates the output [%] of the heater 120.

As apparent from FIG. 2A, the AlN/AlGaN film first formed on the wafer 101 has the film thickness of less than 1 μm, and thus, the radiation thermometer 140 hardly measures an accurate temperature due to the thin-film interference, and the measured temperature is slightly varied. Thus, the output of the heater 120 is controlled to be constant as illustrated in FIG. 2B while the AlN/AlGaN film is formed.

In addition, the temperature of the GaN film, which has been subsequently formed, measured by the radiation thermometer 140 is also slightly varied due to the thin-film interference as illustrated in FIG. 2A. However, a sum of the film thicknesses of the two films gradually increases to exceed 2 μm eventually, and thus, the temperature measured by the radiation thermometer 140 is considerably stabilized by the time the film formation of the GaN film is finished. The output of the heater 120 is controlled to be constant during the formation of the GaN film as illustrated in FIG. 2B since it is not easy to change the control scheme of the film formation in the middle of forming of the GaN film.

The output of the heater 120 is controlled to be constant in each film in the case of forming any film when the output of the heater 120 is controlled to be constant. In this case, for example, the supply of the material gas is stopped after the AlN/AlGaN film as an under layer is formed, the output of the heater is varied such that a value measured by the radiation thermometer becomes a film-formation temperature of the GaN film to be formed, and the output of the heater 120 is sampled and set to an average value thereof immediately before the material gas of the GaN film is supplied to form the film.

The output of the heater 120 at the time of forming the AlN/AlGaN film is different from the output of the heater 120 at the time of the formation of the GaN film in the example of FIG. 2B, but each output of the heater 120 is constant at the time of forming either film. Incidentally, the output of the heater 120 in FIG. 2B is an example, and the output is adjusted to predetermined output on the basis of a type or thickness of a film to be formed.

Since the film thickness of the film on the wafer 101 exceeds 2 μm at the stage of finishing the formation of the GaN film, the measurement accuracy of the temperature measured by the radiation thermometer 140 increases, and the temperature is not substantially varied as illustrated in FIG. 2A. Thus, the "temperature feedback control" is performed at a stage of forming the MQW film. Accordingly, the film formation can be performed by setting the temperature of the surface of the wafer 101 to a predetermined temperature although the output of the heater 120 is not necessarily constant as illustrated in FIG. 2B. Accordingly, it is possible to perform the film formation in the state of keeping an ideal temperature condition, and to provide the uniform film thickness and film quality.

It is well known that an emission wavelength increases when In is much more incorporated into the MQW film, for example, and the emission wavelength decreases when the amount of the incorporated In is decreased. Therefore, it is necessary to cause a gas containing In to flow from the shower plate 124 into the chamber 103 at the time of forming the MQW film. Incidentally, a heat transfer rate onto the wafer 101 is changed when a gas flow rate is changed, and accordingly, the temperature of the surface of the wafer 101 is slightly changed, and the amount of In to be incorporated into the MQW film is changed. Therefore, it is possible to make the amount of In to be incorporated into the MQW film uniform by accurately measuring the temperature of the surface of the wafer 101 by the radiation thermometer 140, and finely adjusting the output of the heater 120 according to the measured temperature. Accordingly, it is possible to suppress a deviation of the wavelength of light emitted from the MQW film.

Figure 3:
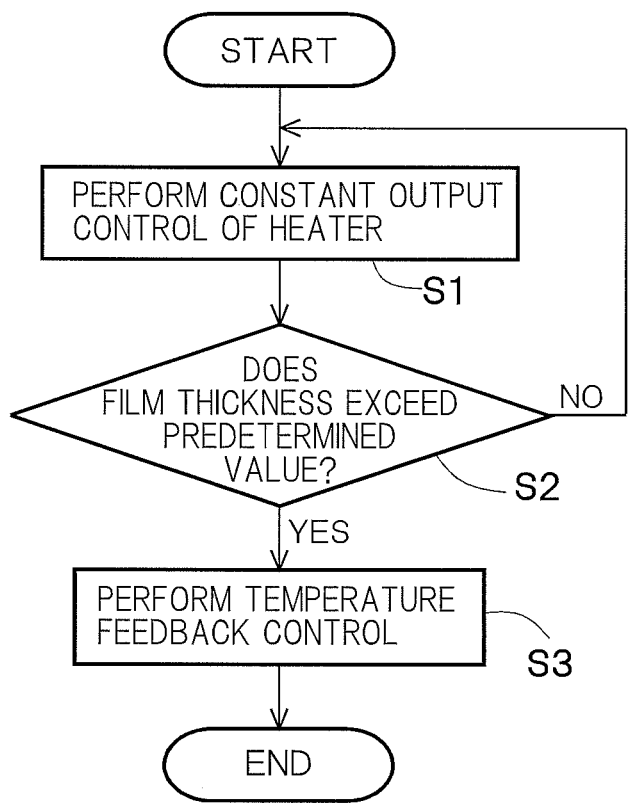
FIG. 3 is a flowchart illustrating an example of a procedure of a vapor deposition process which is performed by a controller 10 in the vapor deposition apparatus 100 of FIG. 1.

FIG. 3 is a flowchart illustrating an example of a procedure of a vapor deposition process which is performed by a controller 10 in the vapor deposition apparatus 100 of FIG. 1. The flowchart illustrates the processing procedure after the wafer 101 is placed on the support base 102.

Since the film thickness is less than 2 μm in an initial state, the controller 10 performs the "constant output control" which keeps the output of the heater 120 constant (Step S1). In this manner, the controller 10 performs the deposition of the film without depending on the temperature measured by the radiation thermometer 140, until the total film thickness reaches a threshold value.

Next, the controller 10 determines whether the film thickness exceeds a predetermined threshold value (for example, 2 μm) (Step S2). The determination is performed in Step S2 on the basis of, for example, an output value of the heater 120 set in Step S1, a heating time of the heater 120, and a flow rate and a type of the gas flowing from the shower plate 124 into the chamber 103. Alternatively, it may be determined whether the film thickness exceeds 2 μm with reference to a condition under which the past film formation has been performed. Alternatively, the film thickness may be actually measured by a film thickness measuring instrument or the like.

When it is determined that the film thickness does not exceed 2 μm yet in Step S2, the procedure returns to Step S1, the output of the heater 120 is controlled to be constant to form a new film. At this time, the type and the flow rate of the gas flowing from the shower plate 124 into the chamber 103 are set according to a type and a film thickness of the new film. In addition, an output value of the heater 120, which is different from that at the time of the immediately previous film formation, may be set according to the type or the film thickness of the film while setting the output of the heater 120 to be constant.

When it is determined that the film thickness exceeds 2 μm in Step S2, the "temperature feedback control" is performed (Step S3). That is, the temperature measured by the radiation thermometer 140 is monitored, and a new film is formed while adjusting the output of the heater 120 such that the temperature of the surface of the wafer 101 becomes the pre-set temperature in Step S3. After the total value of the film thicknesses of the respective formed films exceeds 2 μm, each film formation is performed under the "temperature feedback control" similarly to Step S3. Accordingly, the process of Step S3 is repeated according to the number of films which are desired to be formed.

The "temperature feedback control" is performed when the film thickness of the film formed on the wafer 101 is 2 µm or more in the above-described embodiment, but the threshold value of 2 µm is a simple example, and may be, for example, from 3 µm to 4 µm. It is desirable to set an optimal threshold value depending on the radiation thermometer 140 to be used. Herein, the threshold value is a film thickness equal to or more than a minimum value with which the radiation thermometer 140 is not affected by the thin-film interference.

In this manner, the film formation is performed by controlling the output of the heater 120 to be constant in a case in which the film thickness of the film formed on the wafer 101 is the threshold value or less, and it is determined that the temperature measured by the radiation thermometer 140 is accurate when the film thickness exceeds the threshold value, and the "temperature feedback control" is performed using the corresponding temperature, in this embodiment. In this manner, the film formation is performed without using the temperature measured by the radiation thermometer 140, which hardly detects the accurate temperature, in a case in which the film thickness is the threshold value or less, and thus, the value measured by the radiation thermometer 140 is not affected by the thin-film interference. Further, the "temperature feedback control" is performed using the temperature measured by the radiation thermometer 140 when the film has a film thickness which allows the temperature measured by the radiation thermometer 140 to be reliable, and thus, it is possible to control the output of the heater 120 to the predetermined temperature even in a state in which the temperature of the surface of the wafer 101 is varied, and it is possible to perform the film formation with a composition at a film formation speed as originally intended.

In this manner, according to this embodiment, it is possible to form the high-quality film while avoiding the influence of the thin-film interference, even in a state in which the thin-film interference occurs. Therefore, it is unnecessary to correct the emissivity using the emissivity correction thermometer which is expensive and lack of reliability.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A vapor deposition method comprising:
supplying a material gas onto a substrate while heating the substrate by a heater to sequentially form a plurality of films with vapor deposition;
growing the plurality of films under a constant output control, which keeps an output of the heater to be constant in each of the plurality of films, until a total film thickness of the plurality of films formed on the substrate reaches a threshold value; and
growing the plurality of films under a temperature feedback control, which controls the output of the heater based on a temperature of the substrate measured by a radiation thermometer, after the total film thickness reaches the threshold value.

2. The vapor deposition method according to claim 1, wherein
the plurality of films is grown without depending on the temperature measured by the radiation thermometer until the total film thickness reaches the threshold value.

3. The vapor deposition method according to claim 1, wherein
the output of the heater is kept at an average of outputs of the heater sampled immediately before forming any one of the plurality of films until the total film thickness reaches the threshold value.

4. The vapor deposition method according to claim 1, wherein
the output of the heater is individually set for each film, and the set output is kept during each film formation period of the plurality of films until the total film thickness reaches the threshold value.

5. The vapor deposition method according to claim 1, wherein
the threshold value is a film thickness which is equal to or more than a minimum value with which the radiation thermometer is not affected by thin-film interference.

6. The vapor deposition method according to claim 1, wherein
the threshold value is 2 µm or more.

7. A vapor deposition apparatus comprising:
a reaction chamber in which a plurality of films is formed on an upper surface of a substrate through a vapor deposition reaction;
a gas feeder which supplies a gas to the reaction chamber;
a heater which heats the substrate from a rear surface side of the substrate;
a radiation thermometer which is arranged above the upper surface of the substrate and measures temperature of the substrate; and
a controller which controls an output of the heater,
wherein the controller performs a constant output control, which keeps the output of the heater to be constant, until a total film thickness of the plurality of films formed on the substrate reaches a threshold value, and performs a temperature feedback control, which controls the output of the heater based on a temperature of the substrate measured by the radiation thermometer, after the total film thickness reaches the threshold value.

8. The vapor deposition apparatus according to claim 7, wherein
the controller grows the plurality of films without depending on the temperature measured by the radiation thermometer until the total film thickness reaches the threshold value.

9. The vapor deposition apparatus according to claim 7, wherein
the controller keeps the output of the heater at an average of outputs of the heater sampled immediately before forming any one of the plurality of films, until the total film thickness reaches the threshold value.

10. The vapor deposition apparatus according to claim 7, wherein
the controller individually sets the output of the heater for each film, and the set output is kept during each film formation period of the plurality of films until the total film thickness reaches the threshold value.

11. The vapor deposition apparatus according to claim 7, wherein
the threshold value is a film thickness which is equal to or more than a minimum value with which the radiation thermometer is not affected by thin-film interference.

12. The vapor deposition apparatus according to claim 7, wherein
the threshold value is 2 μm or more.

* * * * *